(12) United States Patent
Glueck et al.

(10) Patent No.: US 8,154,897 B2
(45) Date of Patent: Apr. 10, 2012

(54) RF POWER SUPPLY

(75) Inventors: Michael Glueck, Freiburg (DE); Alex Miller, Freiburg (DE); Erich Pivit, Allmersbach im Tal (DE)

(73) Assignee: HUETTINGER Elektronik GmbH + Co. KG, Freiburg (DE)

( * ) Notice: Subject to any disclaimer, the term of this patent is extended or adjusted under 35 U.S.C. 154(b) by 470 days.

(21) Appl. No.: 12/178,414

(22) Filed: Jul. 23, 2008

(65) Prior Publication Data
US 2009/0027936 A1   Jan. 29, 2009

Related U.S. Application Data

(60) Provisional application No. 60/951,392, filed on Jul. 23, 2007.

(30) Foreign Application Priority Data

Apr. 3, 2008   (WO) ................. PCT/EP2008/002657

(51) Int. Cl.
   *H02M 7/537*   (2006.01)
(52) U.S. Cl. ....................................................... 363/131
(58) Field of Classification Search .................. 363/97, 363/98, 131; 315/111.21, 209 R, 219, 291
   See application file for complete search history.

(56) References Cited

U.S. PATENT DOCUMENTS

| | | | |
|---|---|---|---|
| 3,820,008 A * | 6/1974 | Guarnaschelli | 323/289 |
| 4,215,392 A * | 7/1980 | Rhoads | 363/49 |
| 4,490,684 A | 12/1984 | Epsom et al. | |
| 4,656,434 A | 4/1987 | Selin | |
| 4,701,716 A | 10/1987 | Poole | |
| 4,758,941 A | 7/1988 | Felton et al. | |
| 4,860,189 A | 8/1989 | Hitchcock | |
| 4,921,357 A * | 5/1990 | Karube et al. | 372/38.04 |
| 4,980,810 A * | 12/1990 | McClanahan et al. | 363/16 |
| 5,195,045 A | 3/1993 | Keane et al. | |
| 5,222,246 A | 6/1993 | Wolkstein | |
| 5,225,687 A | 7/1993 | Jason | |
| 5,363,020 A | 11/1994 | Chen et al. | |
| 5,382,344 A | 1/1995 | Hosokawa et al. | |
| 5,394,061 A | 2/1995 | Fujii | |
| 5,424,691 A | 6/1995 | Sadinsky | |

(Continued)

FOREIGN PATENT DOCUMENTS

EP   0073059   3/1983

(Continued)

OTHER PUBLICATIONS

De Vries et al., "Solid State Class DE RF Power Source", Proc. IEEE International Symposium on Industrial Electronics (ISIE'98), vol. 2, pp. 524-529, Pretoria, South Africa, Jul. 1988.

(Continued)

*Primary Examiner* — Gary L Laxton
(74) *Attorney, Agent, or Firm* — Fish & Richardson P.C.

(57) ABSTRACT

An RF power supply, in particular a plasma supply device, for generating an output power greater than 500 W at an output frequency of at least 3 MHz includes at least one inverter connectable to a DC power supply, which inverter comprises at least one switching element and an output network. An accompanying line connects an electrical component to the inverter by a lead-in of the output network.

22 Claims, 7 Drawing Sheets

U.S. PATENT DOCUMENTS

| | | | |
|---|---|---|---|
| 5,434,527 A | 7/1995 | Antone | |
| 5,435,881 A | 7/1995 | Ogle | |
| 5,438,498 A | 8/1995 | Ingemi | |
| 5,563,775 A | 10/1996 | Kammiller | |
| 5,574,410 A | 11/1996 | Collins et al. | |
| 5,610,452 A | 3/1997 | Shimer et al. | |
| 5,810,963 A | 9/1998 | Tomioka | |
| 5,875,103 A | 2/1999 | Bhagwat et al. | |
| 5,944,942 A | 8/1999 | Ogle | |
| 6,229,718 B1 | 5/2001 | Nilssen | |
| 6,246,599 B1 | 6/2001 | Jang et al. | |
| 6,297,696 B1 | 10/2001 | Abdollahian et al. | |
| 6,344,768 B1 | 2/2002 | Daun-Lindberg et al. | |
| 6,365,868 B1 | 4/2002 | Borowy et al. | |
| 6,703,080 B2 * | 3/2004 | Reyzelman et al. | 427/445 |
| 6,791,851 B2 | 9/2004 | Brkovic | |
| 6,909,617 B1 | 6/2005 | Mirskiy | |
| 6,992,902 B2 | 1/2006 | Jang et al. | |
| 7,161,818 B2 | 1/2007 | Kirchmeier et al. | |
| 7,259,623 B2 * | 8/2007 | Coleman | 330/251 |
| 7,312,584 B2 | 12/2007 | Tamita et al. | |
| 7,333,348 B2 | 2/2008 | Horiuchi et al. | |
| 7,353,771 B2 | 4/2008 | Millner et al. | |
| 7,452,443 B2 | 11/2008 | Glueck et al. | |
| 7,755,300 B2 | 7/2010 | Kishinevsky et al. | |
| 7,796,005 B2 | 9/2010 | Blankenship et al. | |
| 7,884,590 B2 | 2/2011 | Liu | |
| 2003/0215373 A1 | 11/2003 | Reyzelman et al. | |
| 2004/0031566 A1 | 2/2004 | Takahashi et al. | |
| 2004/0114399 A1 | 6/2004 | Lincoln et al. | |
| 2005/0088231 A1 | 4/2005 | Ziegler | |
| 2005/0122087 A1 | 6/2005 | Sakai et al. | |
| 2006/0252283 A1 | 11/2006 | Takeda et al. | |
| 2007/0121267 A1 | 5/2007 | Kotani et al. | |
| 2007/0145900 A1 | 6/2007 | Kirchmeier et al. | |
| 2009/0153127 A1 | 6/2009 | Chen | |

FOREIGN PATENT DOCUMENTS

| | | |
|---|---|---|
| EP | 1 272 014 | 1/2003 |
| EP | 1783904 | 10/2005 |
| EP | 1 701 376 | 9/2006 |
| EP | 1701376 | 9/2006 |
| EP | 1 783 904 | 5/2007 |
| JP | 55082967 | 6/1980 |
| WO | 9749267 | 12/1997 |
| WO | 9857406 | 12/1998 |
| WO | 2005094138 | 6/2005 |

OTHER PUBLICATIONS

Walker et al., "An Isolated MOSFET Gate Driver". Australasian Universities Power Engineering Conference, AUPEC'96, 1996, vol. 1, Melbourne, pp. 175-180.

International Search Report from corresponding PCT Application No. PCT/EP2008/002657, mailed Sep. 15, 2008, 11 pages.

Power Generator.

* cited by examiner

RF POWER SUPPLY

CROSS REFERENCE TO RELATED APPLICATIONS

This application claims priority under 35 U.S.C. §119(e) to U.S. patent No. 60/951,392, filed on Jul. 23, 2007 and under 35 U.S.C. §119(a) to PCT/EP2008/002657, filed on Apr. 3, 2008. Both of these priority applications are hereby incorporated by reference in their entirety.

TECHNICAL FIELD

The invention relates to a plasma supply device for generating an output power greater than about 500 W at an essentially constant basic frequency greater than about 3 MHz for a plasma process.

BACKGROUND

A plasma supply device is a plasma current supply that supplies plasma processes with electric power. The plasma supply device operates at a basic frequency that, when used as a plasma power supply, should only deviate slightly from a theoretical value. Typical basic frequencies in the radio frequency (RF) spectrum are, for example, 3.39 MHz, 13.56 MHz, 27 MHz, 40 MHz and 62 MHz. An inverter, which includes two switching elements, generates from a DC signal of a DC power supply an alternating signal that changes its sign or its amplitude periodically at the rate of the basic frequency. For this purpose, the switching elements are switched backwards and forwards between a conducting and a non-conducting state at the rate of the basic frequency. An output network generates from the alternating signal generated by the inverter a sinusoidal output signal at essentially the predetermined basic frequency.

A plasma is a special aggregate condition that is produced from a gas. Every gas consists in principle of atoms and/or molecules. In the case of a plasma, the gas is largely ionized, which means that the atoms and/or molecules are split into positive and negative charge carriers, i.e. into ions and electrons, due to the supply of energy. A plasma is suitable for processing workpieces because the electrically charged particles are chemically highly reactive and can also be influenced by electrical fields. The charged particles can be accelerated by means of an electrical field on a workpiece, where they can release individual atoms from the workpiece on collision. The released atoms can be removed by gas flow (etching) or coated on other workpieces (production of thin films). A plasma can be used to deposit extremely thin layers, for example, in the region of few atom layers. Typical applications for plasma processing are semiconductor technology (coating, etching, etc.), flat screens (similar to semiconductor technology), solar cells (similar to semiconductor technology), architectural glass coating (heat protection, dazzling protection, etc.), storage media (CD, DVD, hard discs), decorative coatings (colored glasses, etc.) and tool hardening. These applications impose high demands in terms of accuracy and process stability.

Furthermore, a plasma can also be used to excite lasers, particularly gas lasers.

To generate a plasma from a gas, energy is supplied to the gas. Energy can be supplied in different ways, for example, as light, heat or electrical energy. Moreover, a plasma can be ignited with the electrical energy. A plasma for processing workpieces is typically ignited in a plasma chamber, for which purpose an inert gas, e.g. argon, is generally filled into the plasma chamber at low pressure. The gas is exposed to an electrical field that is produced by electrodes and/or antennae.

A plasma is generated or is ignited when several conditions are met. A small number of free charge carriers must be present, and in most cases use is made of the free electrons that are always present to a small extent. The free charge carriers are accelerated so much by the electrical field that they create additional electrons when colliding with atoms or molecules of the inert gas, thus producing positively charged ions and additional electrons. The additional charge carriers are again accelerated and on collision produce additional ions and electrons. An avalanche effect is created. The natural recombination counteracts the constant generation of ions and electrons, i.e. electrons are attracted by ions and recombine to form electrically neutral atoms and/or molecules. Therefore energy is constantly supplied to an ignited plasma in order to maintain the plasma.

SUMMARY

In one aspect, an RF power supply for generating an output power larger than 500 W at an output frequency of at least 3 MHz, the power supply includes, connectable to a DC power supply, at least one inverter with at least one switching element, whose reference potential changes synchronously with the RF in operation, and with at least one output network and an accompanying line connecting an electrical component at a reference potential with substantial time variations to an access point, which is largely free from time variations of a voltage potential.

In another aspect, a method for operating an RF power supply, in particular a plasma power supply, with a driver power supply for a driver of an inverter, wherein the reference potential of a switching element of the inverter is on an RF potential in operation includes feeding a supply current of the driver via an accompanying line, into an access point of an output network that is largely free of an RF potential.

In another aspect, a method for operating an RF power supply with a driver of an inverter, wherein the reference potential of a switching element of the inverter jumps backwards and forwards relative to earth between different potentials, includes, via an accompanying line, feeding a driver output signal for the switching element into an access point of an output network that is largely free of a time variable electrical potential.

Some embodiments provide an RF power supply device, which meets the requirements mentioned for a plasma power supply and which guarantees reliable supply, controlling or monitoring even of the switching elements or other floating components.

In another aspect, an RF power supply device includes an accompanying line that connects an electrical component on a reference potential varying in time, to an access point at a non-floating potential that at least to some extent does not vary in the RF time scale, particularly at the basic frequency. The component can form part of the inverter or can be connected to the inverter. The component can be, e.g., a driver or a measuring device.

Implementations can include one or more of the following features. The accompanying line can connect an electrical component of, e.g., the inverter with an access point. The reference point of the inverter can be connected to a potential of the output network line of the output network which varies in time (floating potential). The potential of the access point can in general not vary in time (non-floating potential) and can be located in a region, e.g., in the spatial vicinity, of a point of the output network line of the output network that does not vary in the RF time scale (e.g., at a non-floating potential). The accompanying line also has this highly variable potential where the output network line of the output network is connected to the component and its reference point therefore has a potential that varies considerably from the DC power supply or the device earth. The accompanying line has little or no RF potential where the potential of the output network line of the output network does not vary in the RF time scale. The intensity of the RF potential is reduced along the course of the accompanying line by inductive and capacitive coupling to the output network line.

An advantage of the above configuration resides in the fact that one can supply, control, or monitor electrically the component, whose reference point has a reference potential that varies continually in time, through an access point, the potential of which does not vary in the RF time scale, via the accompanying line.

The accompanying line can be arranged in the spatial vicinity of the output network line of the output network, e.g., both lines are separated by a certain distance from each other. In the coupling region, the lines are only coupled together capacitively by the capacitance between the two lines and inductively by the inductances of the lines. The accompanying line can therefore be located in the region of the output network line and can run, at least in sections, along the output network line.

Thus, the accompanying line can be run parallel to the output network line, can be twisted with it or arranged in a bifilar manner. Then, the magnetic field lines of a magnetic field, which are formed around the output network line because of the current flowing therethrough, also enclose the accompanying line as completely as possible, thereby providing a high magnetic coupling.

The accompanying line can be surrounded or enclosed spatially or in a planar manner by the output network line. For example, the output network line can be of a planar design, the accompanying line being laid in the center of the output network line. Alternatively, the accompanying line can be enclosed by a tubular shaped output network line.

The accompanying line can have a much smaller dimension than the output network line.

Most of the RF potential of the output network line is applied to the primary winding of the output transformer, which is the main function part of the output network line. The accompanying line can be designed as an accompanying winding. As the accompanying winding and the primary winding can have exactly the same geometric shape, they can be subject to the same RF magnetic influences.

The accompanying line can have an access point in the vicinity of a point of the output network line, which is largely free from time variations of the RF potential. If the inverter has two half bridges, which drive the primary winding of the output transformer in the opposite direction, the access point of the accompanying line can be provided in the vicinity of the center of the primary winding. In order to block off the center of the primary winding in a defined manner, and hence provide that the potential of the center of the primary winding does not vary in the RF time scale, the center of the primary winding can be provided with a tapping and can be connected to a center of the DC power supply of the inverter, which can be formed by two capacitors which are connected in series to the connectors of the DC power supply.

Separate accompanying windings, which are orientated along the course of the primary winding, can be run to, e.g., the switching elements of each half bridge, whose reference points have a highly variable potential from access points in the vicinity of the central tapping of the primary winding.

If the output network line is configured, entirely or partially, as a planar structure on a circuit board, the accompanying line can be insulated from the output network line in the center of the structure. The accompanying line can then be enclosed by the output network line. The accompanying line can also be arranged on a further layer of a multi-layer circuit board parallel to the output network line.

The output network line and the accompanying lines can be connected to each other capacitively beyond their self-capacitance. This can be achieved by at least one discrete capacitor. The capacitor can be integrated in the circuit with low inductance. An increase in the capacitive coupling can be achieved if a capacitor is arranged at each of a plurality of points. The capacitive coupling can be increased in the vicinity of the point on the central tapping of the primary winding, which does not vary in the RF time scale. The point can be in the vicinity of the switching element, e.g. of a MOSFET, or throughout the extent of the common path at any points of common distance along the output network line and the accompanying line; e.g, along the primary winding and the associated winding.

Moreover, the accompanying line can be run through at least one component of the output transformer increasing a magnetic field. This provides an extremely good inductive coupling. The accompanying line can be run together with an output network line through the element increasing the magnetic field.

If the electrical supply, control or observation of the component requires a plurality of connectors, a corresponding plurality of accompanying lines can be run along the output network line, e.g., in the manner described. In certain circuits and for certain signals, for example, in the power supply of the component, it is also possible to use the output network line for this purpose as an alternative to a second accompanying line.

If the component is, for example, a driver for a top switch MOSFET, the first pole of the driver power supply source can be connected to the access point of the accompanying line and the second pole can be connected to the central tapping of the output network line. Thus, the driver power supply for the first pole is provided via the accompanying line and for the second pole via the output network line. The driver power supply source remains in this case on a potential that does not vary in the RF time scale. In this circuit configuration, a common mode choke between the driver power supply source and the driver itself may not be needed.

If a plurality of such half or full bridge circuits are present in a plasma supply device, all the top switch drivers can be fed as a group by a common driver power supply source because all the access points of the accompanying lines are located at one potential that does not vary in the RF time scale. As the common mode chokes can be dispensed with in all the driver power supply lines, the group bottom switch drivers can also be fed directly from a common driver power supply source; the common mode chokes that were previously used at this position for reasons of symmetry may also not be need, thereby saving costs and space compared to a separate driver power supply circuit with galvanic isolation, which is provided for each driver.

Such accompanying lines can also carry the control signals from the drivers to the switching elements. Then, the associated drivers can also remain at a non-floating potential, whilst the reference points of the associated switching elements can be located at a varying potential. In this circuit configuration, one driver power supply source per group can be sufficient.

In some embodiments, measured signals, which derive from the components on the RF variable potential, e.g., the top switch drivers or the associated switching elements, can be transmitted to a non-floating point. For example, electrical signals of a temperature measurement or a measured condition can in this manner be evaluated based on a circuit that is on earth potential or at least on one non-floating potential.

In some embodiments, the inverter can be configured as a half bridge, in which case the access point of the accompanying line, which is essentially not floating, can be provided in the vicinity of a non-floating end of the output network line. If a primary connector is connected directly or via a capacitor to earth or to a pole of the DC power supply, and does therefore not float, the access point of the accompanying line can be provided in its vicinity.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

FIG. 1 is a circuit diagram of a power supply with central feed-in.

FIG. 3 is a circuit diagram illustrating a driver actuation of a switching transistor with central feed-in.

Like reference symbols in the various drawings indicate like elements.

DETAILED DESCRIPTION

Figure 1:
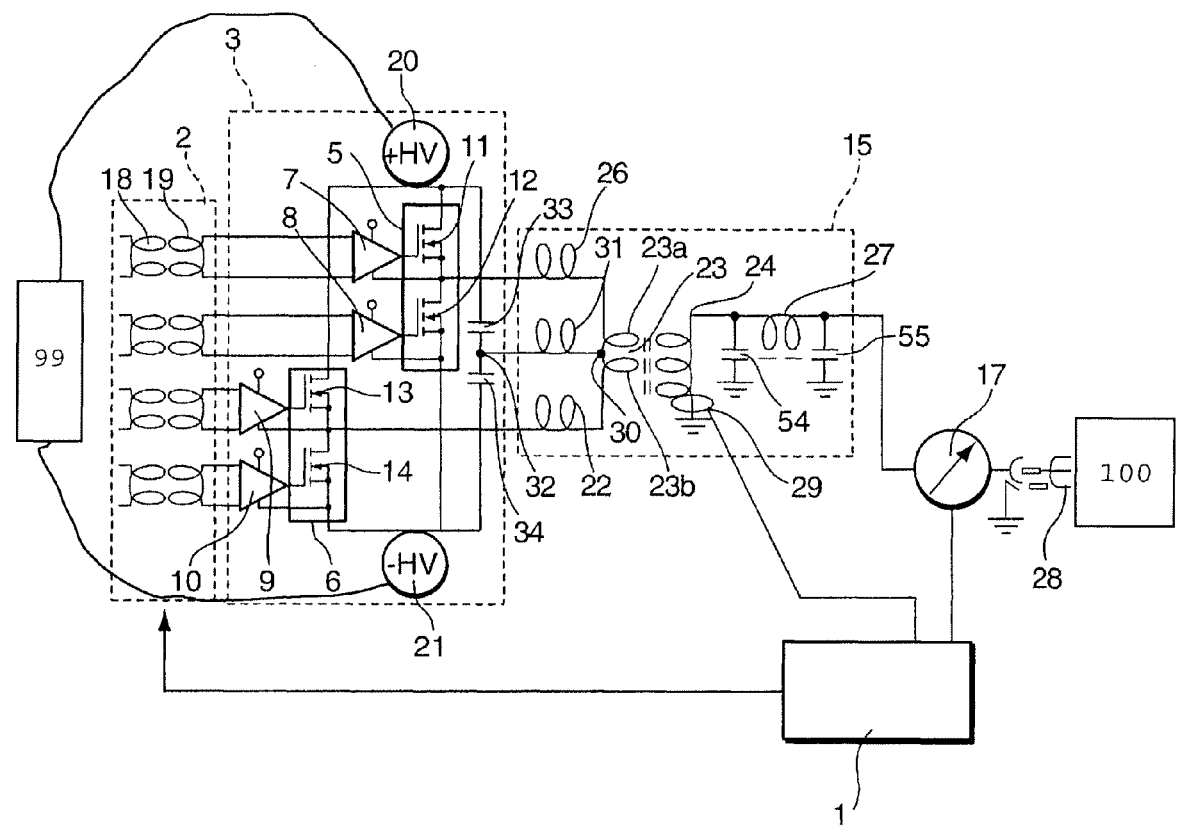

Plasma power supplies should have small dimensions to ensure that they can be arranged in the application close to the plasma discharges. They should have a high repeat accuracy and operate precisely, with small losses to achieve high efficiency. Further requirements include small production costs and maintenance friendliness. If possible, plasma power supplies should be provided without mechanically driven components; ventilators, for example, are undesirable because of their limited life and the risk of contamination. Furthermore, plasma power supplies should be reliable, should not overheat and should have a long life time.

The output network has at least one inverter-side connector and one load-side connector. Connectors on the inverter side are called primary connectors, those on the load side secondary connectors. A connection from one of the connectors to a second connector on the same side is referred to as an output network line. The second connector can lie on RF earth. For example, the output of the inverter, which carries the alternating signal, can be connected to a first inverter-side connector of the output network. From there, a connection can lead inside the output network directly, or via further components, to one end of a primary winding of an output transformer. From the other end of the primary winding, a further connection can lead directly, or via further components, to a second inverter-side connector of the output network. This line, from the first inverter-side connector via the primary winding to the second inverter-side connector of the output network, represents an example of an output network line.

Designing the inverter as a half bridge circuit uses two switching elements, for example, two MOSFET transistors, one of which is connected to the positive, and one of which is connected to the negative pole of a DC power supply. Additional exemplary switching elements include, for example, bipolar power transistors, MOSFETs, IGBTs and thyristors. The transistors are activated complementarily at the basic frequency, thus a generated alternating signal has, alternately, the positive and negative potential of the DC power supply.

The second primary connector can be connected by a capacitor to at least one pole of the DC power supply, and therefore represents an RF earth. Alternatively, the inverter can include a further half bridge that is connected to this second primary connector and that is operated in a push-pull manner relative to the half bridge at the first primary connector. In the following, a full bridge circuit is considered to include a half bridge at each of the two primary connectors.

The MOSFET transistors are activated by a gate-source voltage, where a source connector can be regarded as the voltage reference point of the component.

Because N-channel MOSFETs can have advantages over P-channel MOSFETs, N-channel-MOSFETs are often used for both switching elements of a half bridge.

The source connectors of the N-channel MOSFETs (bottom switch, low side switch, LO-MOSFET) are directly connected to the negative pole of the DC power supply and lie on a essentially constant negative potential. The drain connectors of the N-channel MOSFETs provide the alternating signal with the basic frequency of the plasma power supply device and are connected to the respective primary connector of the output network.

However, the N-channel MOSFETs (top switch, high side switch, HI-MOSFET) are connected to the positive connector of the DC power supply and are switched such that their respective drain connectors are connected to the positive pole of the DC power supply. The source connectors are therefore connected to the output network line of the output network and carry the alternating (power) signal. As in the N-channel MOSFETs the control should take place relative to the source connector with a fast changing high potential difference, driving the gate of the transistors and any components required for the gate should take also place relative to a fast changing reference potential. An incorrect gate-source voltage due to the rapid change of potential can easily lead to instabilities of the half bridge and to the destruction of components.

Electrical measured values for monitoring, for example, internal temperature sensors of the MOSFETs or their driver stages, can have the source connector as a reference potential and therefore can also have a high radio frequency (RF) potential.

FIG. 1 shows an RF power supply such as that used for the power supply for plasma processes. Output powers of more than 500 W are generated at a frequency larger than 3 MHz. The RF power supply includes a control system 1, which is connected to a signal transformer 2. The signal transformer 2 galvanically isolates the control signals (that is, the signals from the control system 1) from high voltage supplied by a DC power supply 99. The signal transformer 2 is connected to a full bridge module 3. In addition to two half bridges 5 and 6, four drivers 7, 8, 9, 10 for half bridge transistors 11, 12, 13, 14 are integrated in the full bridge module 3. The full bridge module 3, acting as an inverter, is connected to an output network 15, which is in turn connected by a measuring device 17 to an external load 100, not shown in further detail, via an output connector 28.

The control system 1 activates four primary windings of the signal transformer 2 with a basic frequency of 3.39 MHz, for example. Secondary windings are connected to the inputs of drivers 7, 8, 9, 10; in particular, the first branch of the signal transformer 2 includes a primary winding 18 and a secondary winding 19, which is connected to an input of the driver 7.

The signal transformer 2 can also be configured to operate with optical signals.

The half bridges 5 and 6 each include two transistors 11, 12 and 13, 14, respectively, which are, e.g., MOSFETs. The transistors 11 and 13 (top switch, high side switch, HI-MOSFET) are connected to a positive DC voltage 20 of the DC power supply 99, and the transistors 12 and 14 (bottom switch, low side switch, LO-MOSFET) are connected to a negative DC voltage 21 of the DC power supply 99. The gate of each transistor 11, 12 and 13, 14 is each connected to an output of the four drivers 7, 8, 9, 10.

The driver 9 switches the transistor 13 as a function of the basic frequency supplied by the control system 1. The same is achieved by the driver 10 for the transistor 14. Not more than one of the transistors 13 and 14 of the half bridge 6 should be conducting while the other of the transistors 13, 14 should be blocked. This mode of operation also applies, in a phase shifted manner, to the drivers 7 and 8 and the transistors 11 and 12 of the half bridge 5.

An RF alternating signal is therefore generated from the DC voltage, which signal changes its sign periodically. The alternating signal is transmitted from the half bridge 5 via a first inductance 26 to a primary winding 23 of an output transformer. The output signal of the first half bridge 6 is also transmitted via a second inductance 22 to the primary winding 23 of the output transformer of the output network 15. A secondary winding 24 of the output transformer transmits the RF signal via an impedance matching element, with capacitors 54 and 55 and an inductance 27, to the output connector 28, which is connected to the external load.

A current meter 29 in the secondary winding 24 of the output transformer and the measuring device 17 are also connected to the control system 1.

The primary winding 23 of the output transformer has a central tapping 30, as a result of which the primary winding 23 is divided into two primary winding halves 23a and 23b. The central tapping 30 is connected via a third inductance 31 to a center 32 of a capacitive voltage divider, which is arranged between the positive DC voltage connector 20 and the negative DC voltage connector 21. Capacitors 33, 34 of the voltage divider operate as bypass capacitors for the half bridges 5 and 6. Current peaks are equalized by the bypass capacitors 33, 34 when transistors 11, 12, 13, 14 are switched. At the same time, voltage drops in the DC power supply (with its connectors 20, 21) are prevented.

The first, second, and third inductances 26, 22, 31 are only responsible for the switching behavior of the transistors, and in some embodiments can be replaced by direct connections.

In the inverter arrangement, described as half or full bridge, there are switching elements with a floating reference potential. A reference potential is floating in that the reference potential is not always constant in time relative to the two potentials of a DC power supply 50. In the circuit described in FIG. 1, this applies to the transistors 11 and 13 and to the reference potential of the associated drivers 7, 9. The source connectors of the transistors 11 and 13 lie at a floating point and the reference potential jumps backwards and forwards relative to the earth of the RF power supply between relatively high potentials, often several hundred volts. For proper operation of the drivers, the electrical potentials of the driver power supply lines on the drivers 7 and 9 should have no time variations relative to the reference potential of the connected top switch transistors 11 and 13, respectively.

Figure 2:
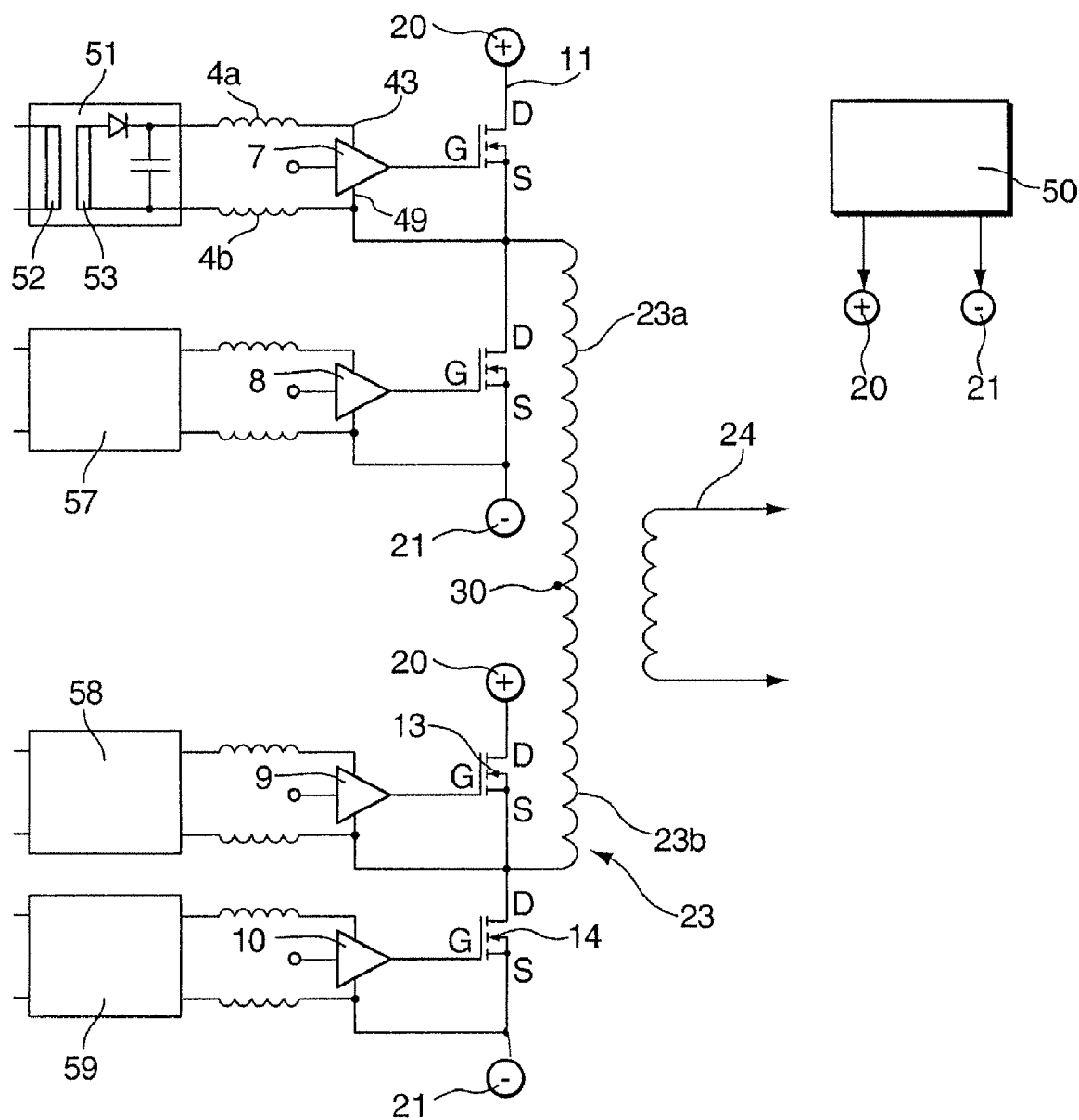
FIG. 2 is a circuit diagram illustrating an control of a switching transistor and a driver power supply.

In FIG. 2, a circuit for the driver power supply of the top switch driver 7 is described in more detail. Furthermore, only the full bridge transistors 11, 12, 13, 14 and the primary winding 23 and the secondary winding 24 of the output transformer of the output network 15 are indicated.

A secondary winding 53 of the transformer in a driver power supply source 51 is connected via a rectifier and a first half 4a of a common mode choke to a power-in-connector 43 of the driver 7. A second connector of the secondary winding 53 of the driver power supply source 51 is connected via a second half 4b of the common mode choke to a power-ground-connector 49.

The common mode choke with the two halves 4a and 4b is used because parasitic coupling capacitances of the transformer with windings 52 and 53, which supplies the driver 7 with an operating voltage, are not arbitrarily small and RF currents from the driver 7 (at RF potential) via the transformer to the supply circuit of a primary winding 52 can be avoided.

Figure 3:
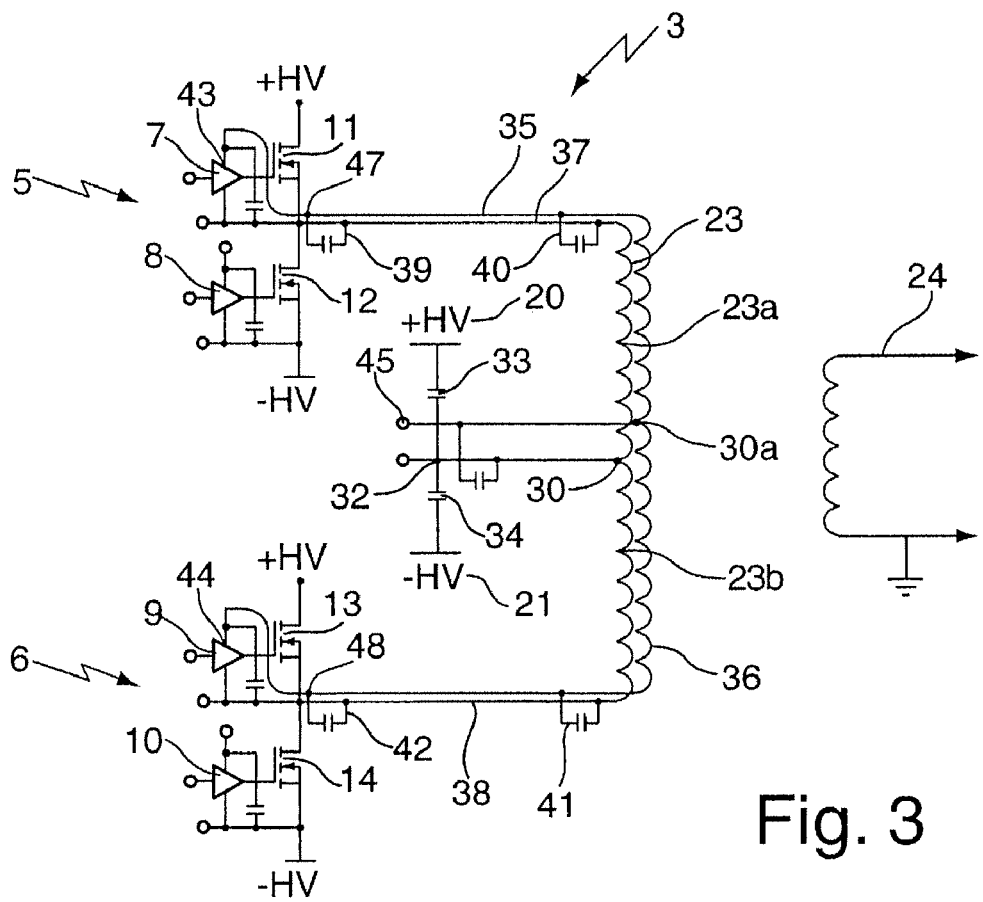

The principle of the accompanying line on the full bridge module 3 will be explained in connection with FIG. 3. One accompanying line 35 and 36 for each of the half bridges 5 and 6, respectively, will be provided for the supplying drivers 7 and 9. The accompanying line 35 and an output network line with the non-floating central tapping 30 of the primary winding 23 are used to transmit the operating voltage to driver 7 of the top switch transistor 11. Similarly, an operating voltage can also be supplied to the driver 9 of the second top switch transistor 13.

For the half bridge 5, the accompanying line 35 leads from a connector 45 of the driver power supply source in the vicinity of the central tapping 30 to an access point 30a. The accompanying line 35 follows then the geometry of the turns of the upper half 23a of the primary winding 23 of the output transformer and those of the first inductance 26, and finally runs to the driver 7. At a nodal point 47, the accompanying line 35 is connected to the power-in-connector 43 of the driver 7.

The accompanying line 35 and the upper half 23a of the primary winding 23 can in this case run in parallel or in a bifilar manner, as a result of which both are magnetically coupled to each other.

The driver 9 of the second half bridge 6 uses the same driver power supply source. As far as the access point 30a, the accompanying line 36 is identical to the accompanying line 35, but then follows the geometry of the turns of the lower half 23b of the primary winding 23 of the output transformer before it runs to the driver 9. At a nodal point 48, the accompanying line 36 is connected to a power-in-connector 44 of the driver 9.

In this case, the second accompanying line 36 follows an output network line 38, particularly the lower half 23b of the primary winding 23. The accompanying line 36 and the lower half 23b of the primary winding 23 can run in parallel or in a bifilar manner, as a result of which both are mechanically coupled to each other.

Each of the accompanying lines 35 and 36 is connected to parallel running output network lines 37 and 38 by a plurality of capacitors. For example, the accompanying line 35 and the output network lines 37 (in the following also referred to as an RF line) are connected via capacitors 39 and 40. The accompanying line 36 and the RF line 38 are connected via capacitors 41 and 42.

The second potential of the driver power supply source is connected to the center 32 and from there is fed via the third inductance 31 to the central tapping 30 of the primary winding 23. At both ends of the primary winding 23, however, the potential is displaced by the RF potential prevailing there, on which the transistors 12 and 13, with their source connectors, are also located.

Figure 4:
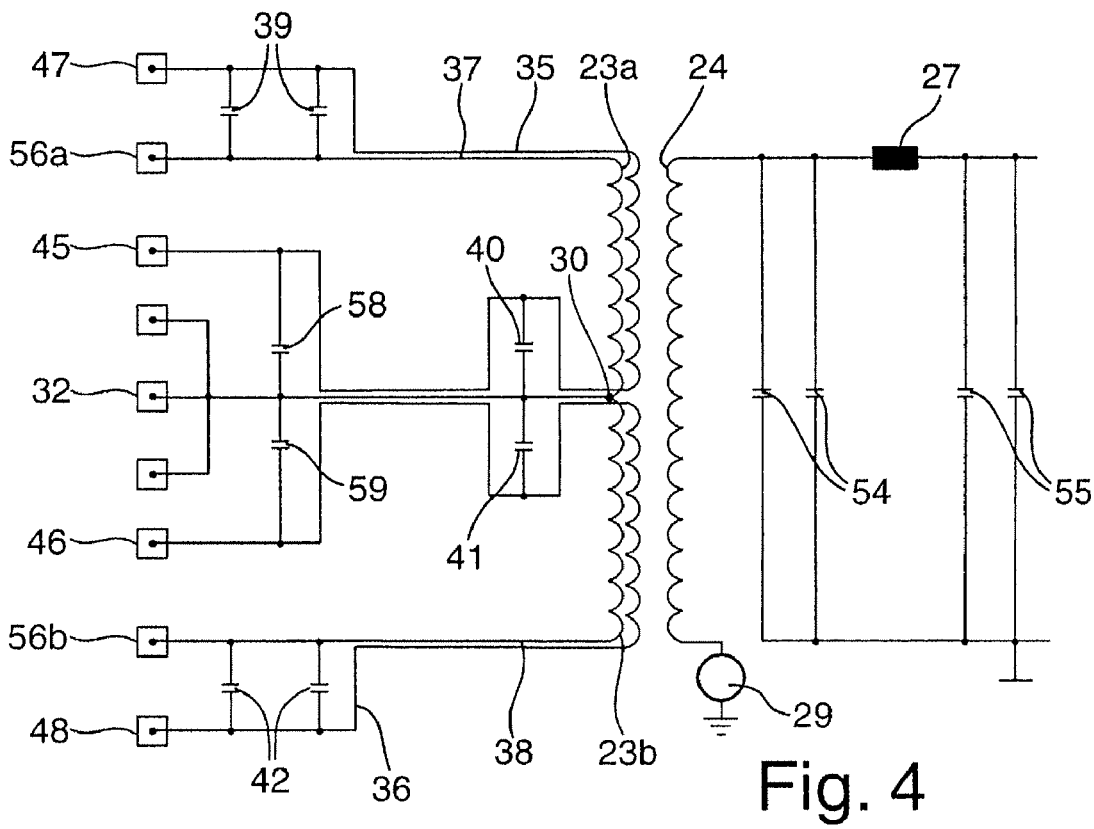
FIG. 4 is a circuit diagram of a representation of the output network corresponding to FIG. 3.

FIG. 4 shows the detailed wiring of the output transformer of the output network 15. The switching elements are not shown. The RF output network line 37 comprises the primary winding half 23a, and the RF output network line 38 comprises the primary winding half 23b. Thus, an RF output network line extends from a primary connector 56a for the alternating signal from the first half bridge via the primary winding 23 to a primary connector 56b for the alternating signal from the second half bridge.

In this circuit configuration, the accompanying lines 35 and 36 run separately beginning at the connectors 45 and 46. The connectors 45 and 46 can be connected to a common pole of the driver power supply source, not shown in this drawing. Capacitors 58 and 59 block the driver power supply connectors 45 and 46 against the center 32, which can be connected to the other pole of the driver power supply source.

The accompanying line 35 leads from the connector 45 into the vicinity of the central tapping 30, and continues as a bifilar associated winding of the upper half 23a of the primary winding 23 to the power-in-connector 47 of the driver 7 of the half bridge 5. Similarly, the accompanying line 36 also leads from the connector 46 into the vicinity of the central tapping 30, and then continues as a bifilar accompanying winding of the lower half 23b of the primary winding 23 to the power-in-connector 48 of the driver 9 of the second half bridge 6.

Coupling capacitances are installed between the output network lines 37 and 38 and the respective lines 35 and 36 of the driver power supply at various points. Thus, the capacitors 39 are switched between the accompanying line 35 and the primary connector 56a, which transmits the output signal of the first half bridge 5, in the vicinity of the power-in-connector 47 of the driver 7 of the first half bridge 5. At least one further capacitor 42 lies between the connector 48 and the power-in-connector of the driver 9 of the half bridge 6 and the primary connector 56b, which transmits the output signal of the second half bridge 6. The capacitances 54 and 55 and the inductance 27 form part of the impedance adaptation element between the secondary winding 24 and the output 28 (FIG. 1).

The capacitors 40 and 41 are provided between the central tapping 30 and each of the in the vicinity running accompanying lines 35 and 36 to keep the three lines non-floating at this point.

Figure 5:
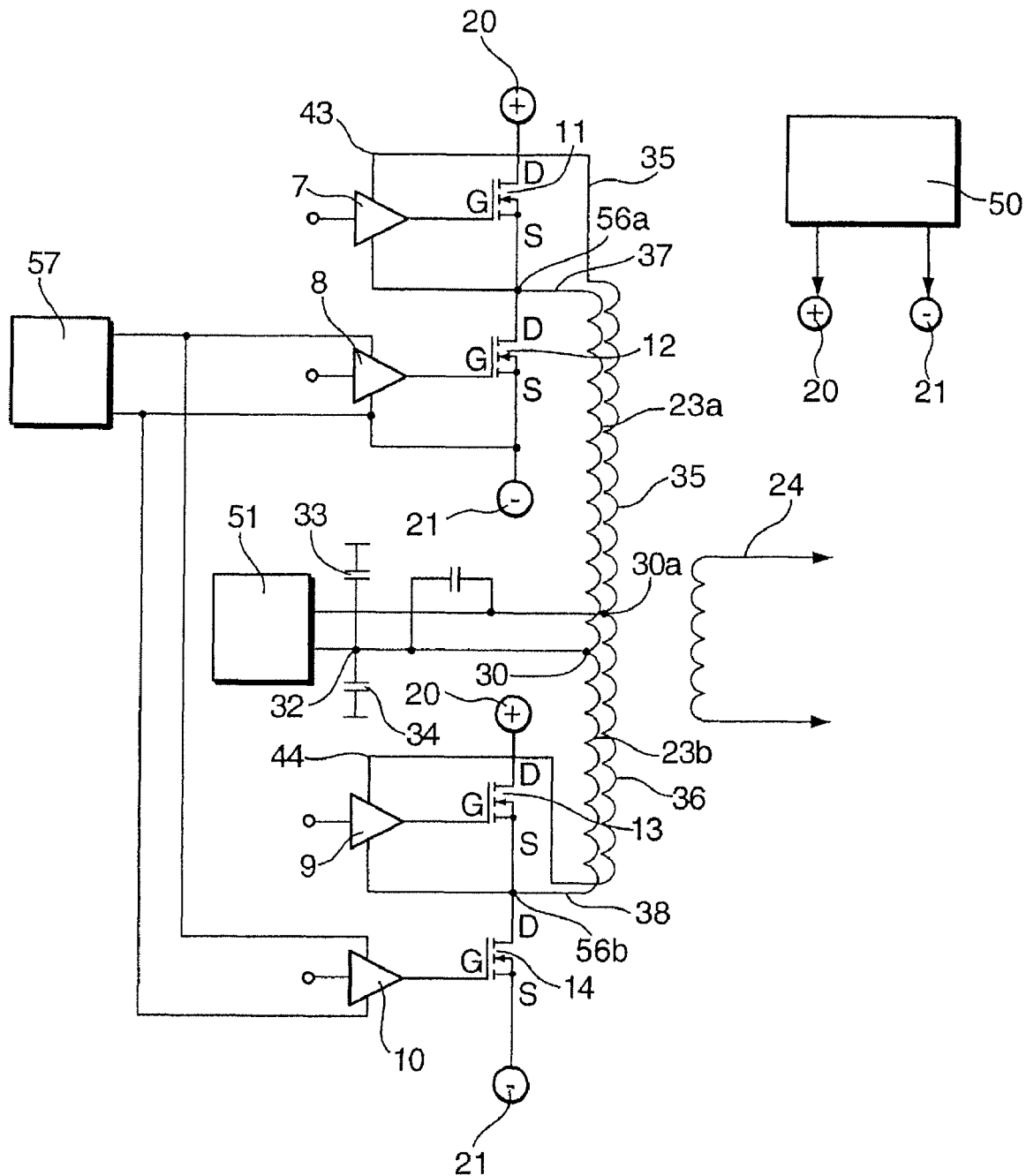
FIG. 5 is a circuit diagram illustrating a driver actuation for a switching transistor with central feed-in in a full bridge.

FIG. 5 illustrates how the top switch drivers 7 and 9 can be operated with only the single driver power supply source 51.

A first connector of the common driver power supply source 51 leads, as a common line of the later divided lines 35 and 36, to the access point 30a and branches off from there. The first accompanying line 35 for the driver power supply follows from the access point 30a onwards the geometry of the winding 23a to the power-in-connector 43 of the driver 7. The second accompanying line 36 for the driver power supply follows from the access point 30a onwards the geometry of the winding 23b to the power-in-connector 44 of the driver 9.

The second connector of the common driver power supply source 51 runs via the center 32 with the capacitors 33 and 34 to the central tapping 30 of the primary winding 23 of the output transformer and via the halves 23a and 23b of the primary winding 23 and via the further course of the output network lines 37 and 38 to the source connectors of the two top switch transistors 11 and 13 and to the power-ground-connectors of the drivers 7 and 9.

The voltage supply of the gates of the top switch transistors 11 and 13 is simplified by this circuit as only a single driver power supply source 51 is used for the top switch drivers 7 and 9.

A driver power supply source 57 feeds the non-floating bottom switch drivers 8 and 10 in the conventional manner. As no common mode chokes are contained in the driver power supply lines of the top switch drivers 7 and 9, the common mode chokes in the driver power supply lines for the bottom switch drivers, which would otherwise be required for reasons of symmetry, are not necessary.

Figure 6:
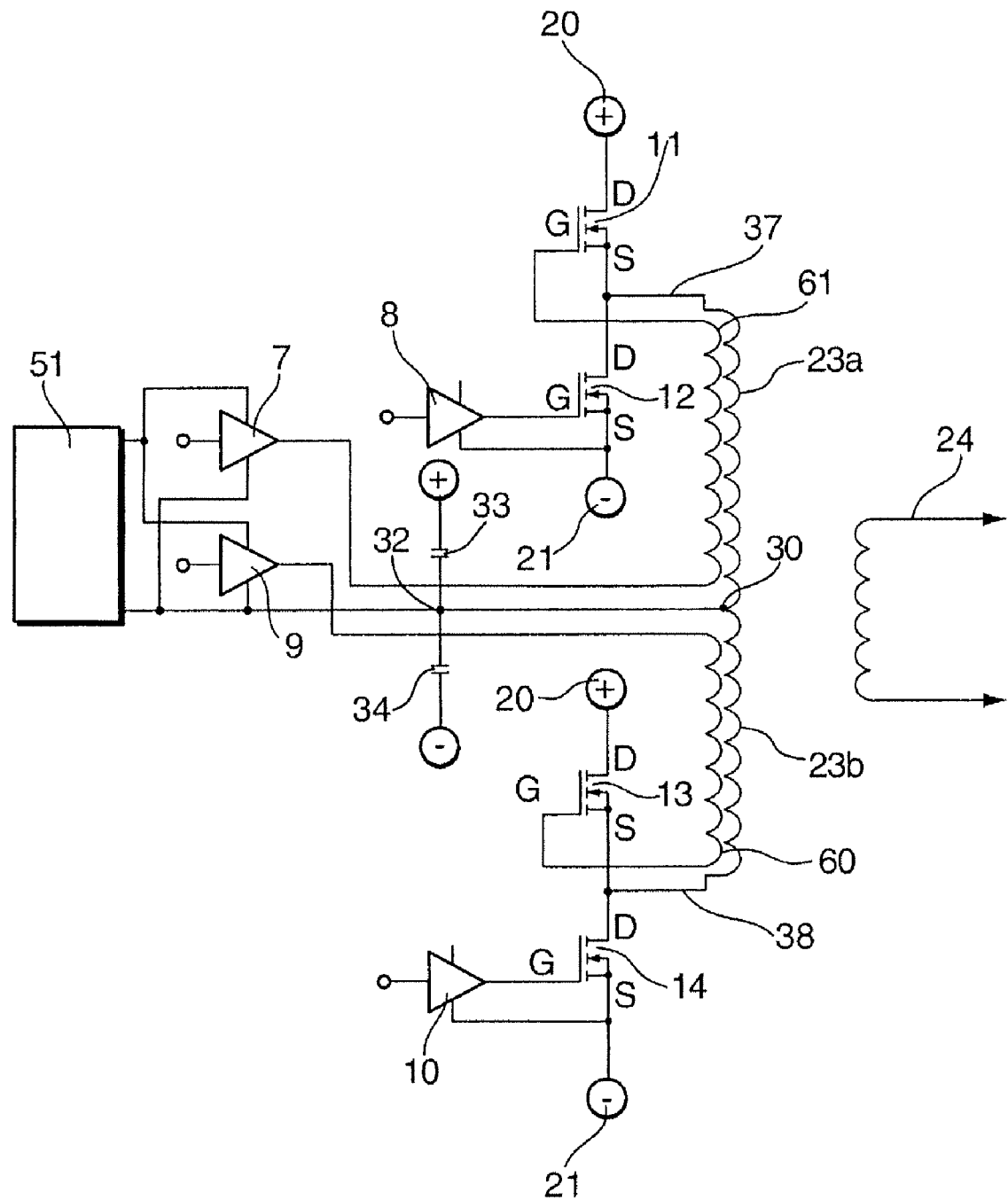
FIG. 6 is a circuit diagram illustrating a gate control for a switching transistor with central feed-in in a full bridge.

In the circuit configuration of FIG. 6, the drivers 7 and 9 are located on a non-floating potential, whilst the associated top switch transistors 11 and 13 are located on a highly variable potential. Accompanying lines 60 and 61 are not used for the driver power supply but directly drive the gates of the top switch transistors 11 and 13.

The accompanying line 61 begins at the output of the driver 7, follows the spatial structures of the upper half 23a of the primary winding 23, as an associated winding, and leads to the gate connector of the transistor 11. Similarly, the accompanying line 60 begins at the output of the driver 9, follows the spatial structures of the winding half 23b, and leads to the gate connector of the transistor 13. The measuring line of the drivers 7 and 9 is connected via the center 32 to the central tapping 30 of the primary winding 23. The source connectors of the top switch transistors 11 and 13 are connected to the respective ends of the primary winding halves 23a and 23b, respectively.

For the case of a half bridge, the course of an accompanying line as the driver power supply 35 or the gate control line 61 is described in greater detail in the following.

Figure 7:
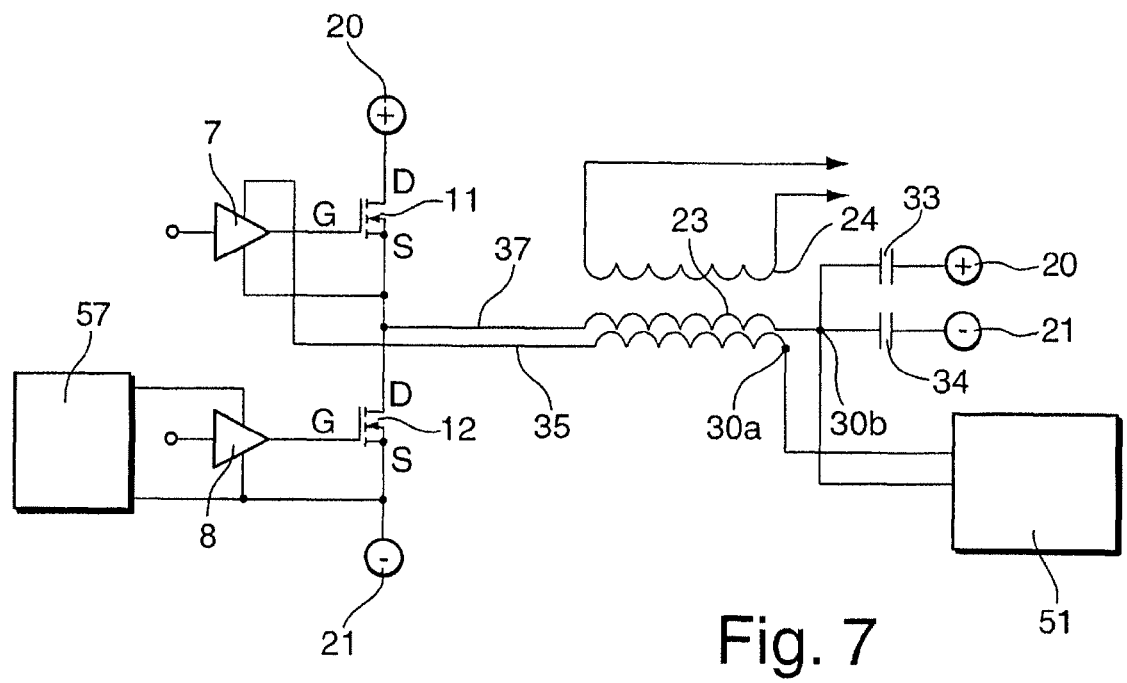
FIG. 7 is a circuit diagram illustrating a driver control for switching transistors in a half bridge.

In FIG. 7, the output of the driver power supply source 51 for the driver 7 is connected by of the accompanying line 35 for the driver power supply directly to the power-in-connector of the driver 7, which activates a gate G of the transistor 11. The other connector of the driver power supply source 51 leads to a point 30b at which the primary winding 23 forms the center of the DC supply by the capacitors 33 and 34, and is therefore RF grounded. The other connector of the primary winding 23 is connected by the output network line 37 to the source connector S of the transistor 11, and also to the power-ground-connector of the driver 7. The positive pole 20 of the DC power supply, whose negative pole 21 lies on the source S of the bottom switch transistor 12 and on the power-in-connector of the driver 8 activating the transistor 12, is connected to a drain connector D of the transistor 11. The accompanying line 35 and the output network line 37 are in this case galvanically isolated but run close together. This applies particularly in the region of the primary winding 23, where the accompanying line 35 is configured as an associated winding.

Figure 8:
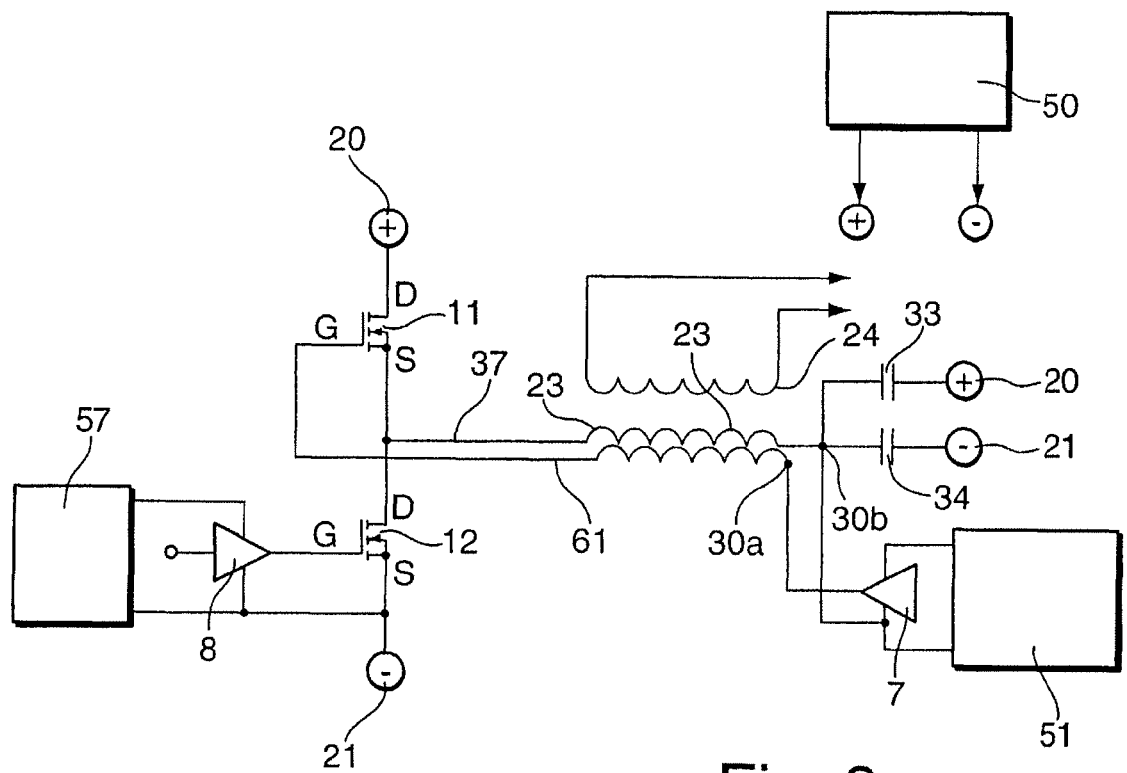
FIG. 8 is a circuit diagram illustrating the driving of a gate for switching transistors in a half bridge.

In an alternative circuit configuration of FIG. 8, the driver 7 is located at a non-floating potential and is connected directly to the driver power supply source 51, and the power-ground-connector of the driver 7 is connected directly to the connector 30b of the primary winding 23, which is connected to earth by the capacitors 33 and 34 at RF. The accompanying line 61, which serves here to drive the gate, connects the control output of the driver 7 in the spatial vicinity of the primary winding 23 of the output transformer with the gate connector G of the transistor 11.

The other connector of the primary winding 23 leads via the output network line 37 to the source connector S of the transistor 11 and is therefore at a high RF potential.

Figure 9A:
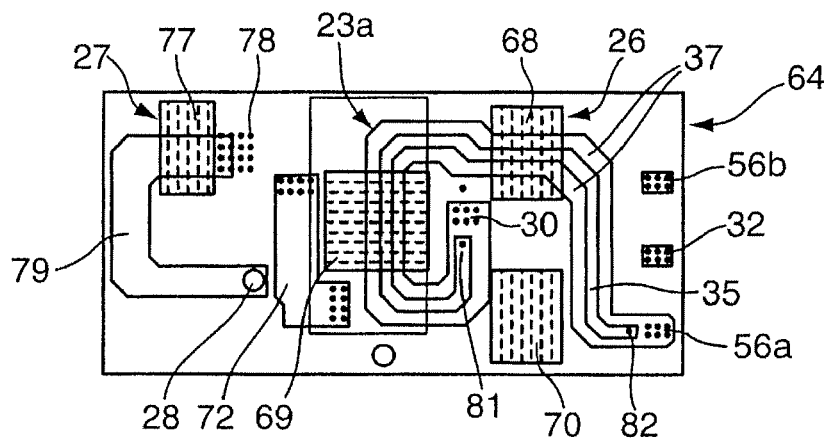
FIGS. 9A-9D are schematic views of four layers of a multilayer circuit board with a central feed-in and driver power supply lines laid in a bifilar manner.
Figure 9B:
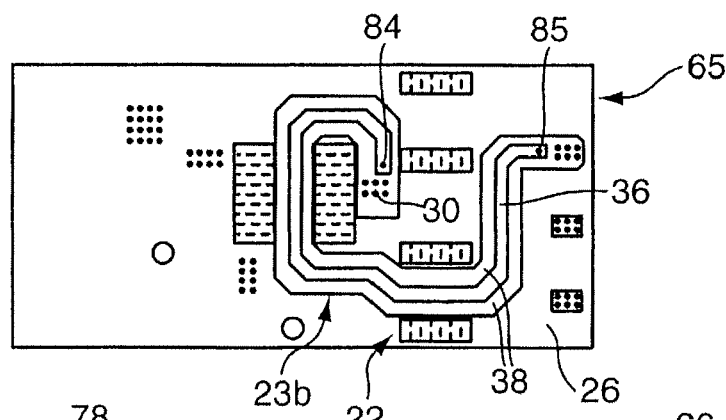
Figure 9C:
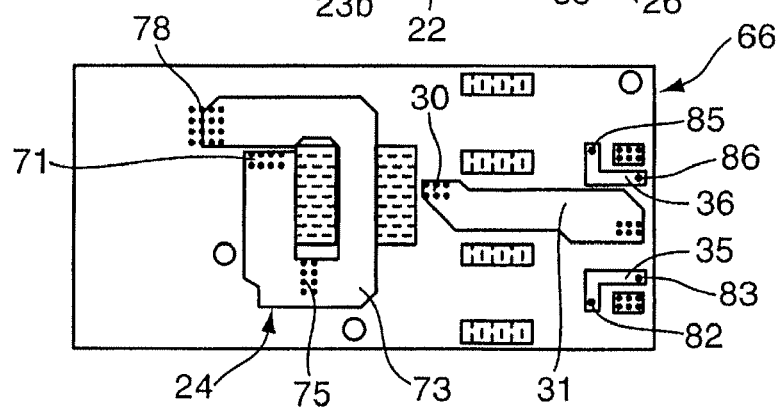
Figure 9D:
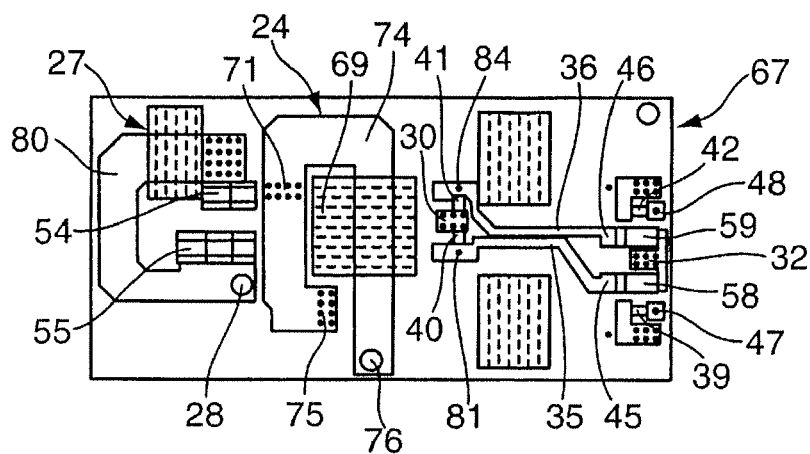

FIGS. 9A-9D show different layers of a multi-layer circuit board, namely a lower layer 64 (FIG. 9A), a first inner layer 65 (FIG. 9B), a second inner layer 66 (FIG. 9C), and an upper layer 67 (FIG. 9D). This multi-layer circuit board forms the output network and carries transformers and inductances of planar design. The switching elements 11, 12, 13, and 14 and their drivers 7, 8, 9, and 10, configured as transistors, are arranged outside the circuit board.

The output network line 37, 39, 23a, 23b passes from the via 56a via a ferrite 68, as a result of which the first inductance 26 is formed. In an area surrounding the ferrite, the output network line forms the first half 23a of the primary winding 23. After passing through the central tapping 30, which is formed from a via field, the output network line forms the other half 23b of the primary winding 23 on the layer 65. The output network line 38 finally leaves the area surrounding a ferrite 69 and, when passing through a ferrite 70, forms the second inductance 22 before returning to the layer 64 with via 56b.

The line 31 on the layer 66, which leads to the center of the DC power supply 32, is formed as a via and is connected to the central tapping 30 formed as a via. In this exemplary embodiment, the line 31 is not configured as a third inductance.

The secondary winding 24 of the output transformer commences on the layer 67 at the earth connector in a bore 76 and runs as a conductor track through the ferrite 69. It then changes in a via field 71 initially to the layer 64 with a conductor track 72, and then to the layer 66 with a conductor track 73. Finally, it changes in a via field 75 to the layer 66, leads further through the ferrite 69 and terminates in a via field 78, where, on the layers 64 and 67, parallel conductor tracks 79 and 80 through a ferrite 77 ensure that the inductance 27 is formed. The two conductor tracks 79 and 80 terminate in the output connector 28, which is formed by a bore. From the via field 78, the capacitor 54 is grounded, and from the end of the conductor tracks near bore 28, the capacitor 55 is grounded. The capacitors 54 and 55 and the inductance 27 form an impedance matching network.

The ferrites each amplify the RF magnetic field.

In the above planar design, the accompanying lines 35 and 36 function as driver power supply lines for the top switch drivers 7 and 9 in the center of the output network line 37, 38, 23a, 23b.

The accompanying line 35 for the driver power supply of the top switch driver 7 commences on the layer 67 at the connector 45, to which the external driver power supply source 51, not shown here, is connected. The accompanying line 35 leads initially on the layer 67 parallel in height to the line 31 to an access point 81, which is formed by a via in the spatial vicinity of the central tapping 30. There it changes to the layer 64 and runs insulated as an accompanying line in the center of the output network line 37, is an accompanying winding of the primary winding half 23a, particularly in the region of the ferrite 69, and extends as far as the vicinity of the primary connector 56a. A via 82 leads the accompanying line 46 to the layer 66, from where a via 83 provides the connector 47 to which the power-in-connector of the top switch driver 7 outside the circuit board is connected.

The accompanying line 36 for the driver power supply of the top switch driver 9 also commences on the layer 67 at the connector 46, which is also connected to the external driver power supply source 51. The accompanying line 36 leads parallel in height to the line 31 to an access point 84, which is formed by a via in the spatial vicinity of the central tapping 30. There the accompanying line switches to the layer 65 and runs insulated as the accompanying line 36 in the center of the output network line 38, is an associated winding of the primary winding half 23b, particularly in the region of the ferrite 69, and extends to the vicinity of the primary connector 56b. A via 85 leads the accompanying line 36 to layer 66, from where a via 86 provides the connector 48 to which the top switch driver 9 located outside the circuit board is connected.

The points near the access points 81, 84 are blocked against the central tapping 30 with the capacitors 40 and 41, and are hence the last non-floating points, before the accompanying lines 35 and 36 continue their path as associated windings in the center of the output network line 37, 38.

The connectors 45, 46 can be connected to the same pole of the same driver power supply source. The second pole of the driver power supply source can then be connected to the center 32, which is connected by the line 31 to the via field of the central tapping 30. The capacitors 58 and 59 block the accompanying lines 35 and 36 at the connectors 45 and 46 off from the center 32.

A number of embodiments of the invention have been described. Nevertheless, it will be understood that various modifications can be made without departing from the spirit and scope of the invention. Accordingly, other embodiments are within the scope of the following claims.

What is claimed is:

1. An RF power supply for generating an output power larger than 500 W at an output frequency of at least 3 MHz, the RF power supply comprising:
    at least one inverter that is configured to be connected to a DC power supply and that has at least one switching element, that is supplied with a floating reference potential in operation;
    at least one output network coupled to the at least one inverter; and
    an accompanying line connecting an electrical component of the inverter at a floating reference potential to an access point at a non-floating potential.

2. The RF power supply of claim 1, wherein the accompanying line is arranged in a region of an output network line of the output network, which output network line is subject to RF currents in operation.

3. The RF power supply of claim 2, wherein the accompanying line is configured to accompany a winding of the output network line.

4. The RF power supply of claim 2, wherein the accompanying line is configured to accompany a primary winding of an output transformer of the output network.

5. The RF power supply of claim 2, wherein the accompanying line is at least one of twisted with the output network line, configured to run parallel to the output network line, arranged in a bifilar manner relative to the output network line, surrounded or enclosed spatially or in a planar manner by the output network line, and enclosed by a tubular shaped output network line.

6. The RF power supply of claim 2, wherein the output network line has a planar configuration and the accompanying line is arranged in the center of the output network line.

7. The RF power supply of claim 2, wherein the output network line and the accompanying line are capacitively connected to each other.

8. The RF power supply of claim 1, wherein the RF power supply is arranged on a multi-layer circuit board and the accompanying line is arranged on a parallel layer in the region of the output network.

9. The RF power supply of claim 1, wherein the accompanying line is run through a component of the output transformer for increasing a magnetic field.

10. The RF power supply of claim 1, wherein the accompanying line is a driver power supply line for feeding a driver supply current of a driver power supply source via the output network line to a driver of the switching element of the inverter.

11. The RF power supply of claim 1, wherein the access point of the accompanying line is located in the vicinity of a point of a primary winding of an output transformer of the output network that is largely free from time variations of an electrical potential.

12. The RF power supply of claim 1, wherein the inverter has two half bridges and the access point of the accompanying line is formed in a region of a central tapping of a primary winding of an output transformer.

13. The RF power supply of claim 12, wherein the output network line and the accompanying line are capacitively coupled by at least one discrete capacitor.

14. The RF power supply of claim 1, further comprising a common driver power supply source for at least two drivers.

15. The RF power supply of claim 1, wherein the accompanying line is configured as a control line that connects via the access point directly to a control connector of the switching element of the inverter.

16. The RF power supply of claim 1, wherein the accompanying line is configured as a measuring line that connects an electrical component, which in operation is on a floating reference potential, via the access point to a measuring device, which in operation is on a non-floating potential.

17. The RF power supply of claim 1, wherein the inverter is configured as a half bridge and the access point of the accompanying line is located in a region of a point of the output network line at a non-floating potential.

18. A method for operating an RF power supply including a driver power supply for a driver of an inverter, wherein a reference potential of a switching element of the inverter is on a floating potential in operation, the method comprising:
via an accompanying line, feeding a supply current of the driver into an access point of an output network that is at an essentially non-floating potential.

19. The method of claim 18, wherein the accompanying line is guided in the region of an output network line.

20. The method of claim 18, wherein the accompanying line and the output network line are at least one of magnetically, electrically, and capacitively coupled.

21. A method for operating an RF power supply including an inverter, a driver of the inverter, and an output network, wherein a switching element of the inverter is on a floating reference potential, the method comprising:
via an accompanying line, feeding a driver output signal for the switching element into an access point of the output network that is at a non-floating potential.

22. The method of claim 21, wherein the accompanying line is guided in a region of an output network line.

* * * * *